United States Patent
Robinson et al.

(10) Patent No.: US 6,663,405 B1
(45) Date of Patent: Dec. 16, 2003

(54) DISCONNECT WATTHOUR METER SOCKET ADAPTER

(75) Inventors: Darrell Robinson, Highland Township, MI (US); Robert Goozen, China, MI (US)

(73) Assignee: Ekstrom Industries, Inc., Farmington Hills, MI (US)

(*) Notice: Subject to any disclaimer, the term of this patent is extended or adjusted under 35 U.S.C. 154(b) by 0 days.

(21) Appl. No.: 10/292,194

(22) Filed: Nov. 11, 2002

Related U.S. Application Data

(62) Division of application No. 09/925,434, filed on Aug. 9, 2001, now Pat. No. 6,520,798.

(51) Int. Cl.[7] ................................................ H01R 29/00
(52) U.S. Cl. ...................... 439/188; 439/517; 439/508; 361/661; 361/102
(58) Field of Search ............................. 439/517, 508, 439/188; 361/661, 663, 102, 670

(56) References Cited

U.S. PATENT DOCUMENTS

| | | | |
|---|---|---|---|
| 3,914,564 A | 10/1975 | Reed et al. | 200/51.1 |
| 3,962,610 A | 6/1976 | Reed et al. | 317/108 |
| 4,772,213 A | 9/1988 | Bell et al. | 439/135 |
| 5,023,747 A | 6/1991 | Lindsay | 361/111 |
| 5,088,004 A | 2/1992 | Howell | 361/668 |
| 5,145,403 A * | 9/1992 | Schaffert et al. | 439/508 |
| 5,572,396 A | 11/1996 | Robinson | 361/117 |
| 5,577,933 A | 11/1996 | Robinson et al. | 439/508 |
| 6,104,586 A | 8/2000 | Robinson | 361/102 |
| 6,152,764 A * | 11/2000 | Robinson et al. | 439/517 |
| 6,325,666 B1 * | 12/2001 | Robinson et al. | 439/517 |
| 6,384,350 B1 * | 5/2002 | Shincovich | 200/5 A |
| 6,475,028 B1 * | 11/2002 | Robinson et al. | 439/517 |

OTHER PUBLICATIONS

Marwell News, 600VAC, Portable Safety Disconnect (PSD), Marwell Corporation, Jan. 2000.

* cited by examiner

*Primary Examiner*—P. Austin Bradley
*Assistant Examiner*—Edwin A. León
(74) *Attorney, Agent, or Firm*—Young & Basile, PC

(57) ABSTRACT

A housing carries an electrical disconnect switch having movable contacts. A cover is mounted on the housing and has an opening allowing access to a control lever of the disconnect switch. Electrical conductors are connected to the disconnect switch within the housing and have a blade terminal portion extending exteriorly of the housing for connection to jaws carried on an electrical component mountable in an electrical watthour meter socket. Degassing ports are formed between the cover and the sidewall of the housing to allow any arcing gasses generated within the interior of the housing to escape from the housing. A handle is mounted centrally on the cover. An ejector handle is movably mounted on the cover and carries an ejector arm to separate the housing from an attached electrical component. A method of removing and remounting a watthour meter in a meter socket is provided, including sequence steps printed on the face of the housing.

25 Claims, 9 Drawing Sheets

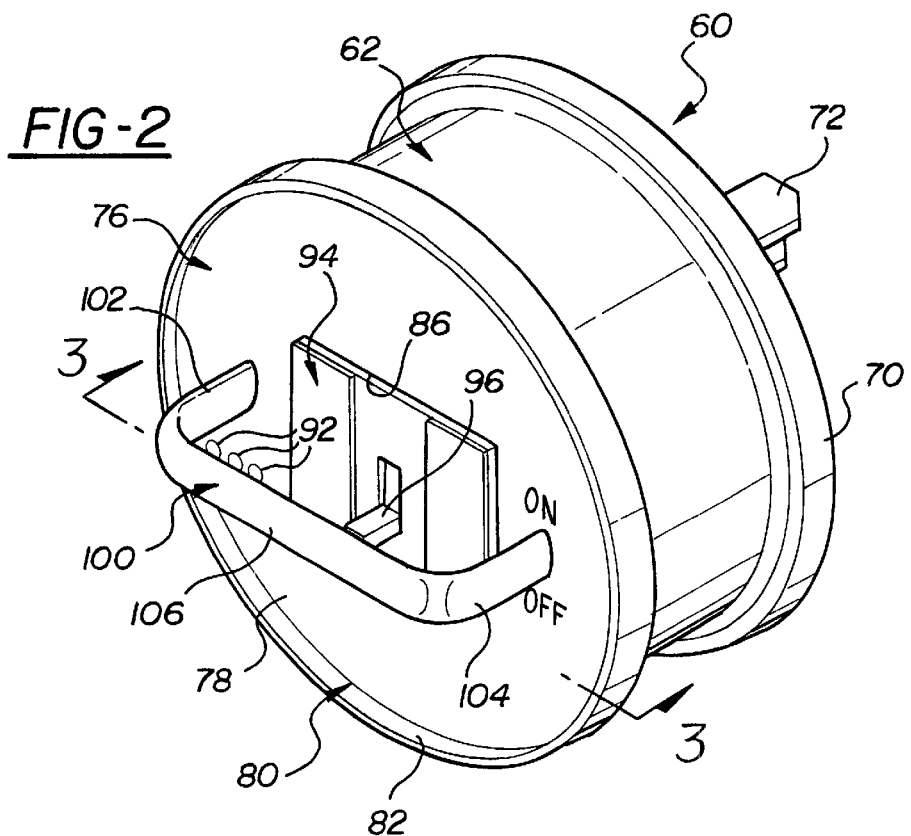
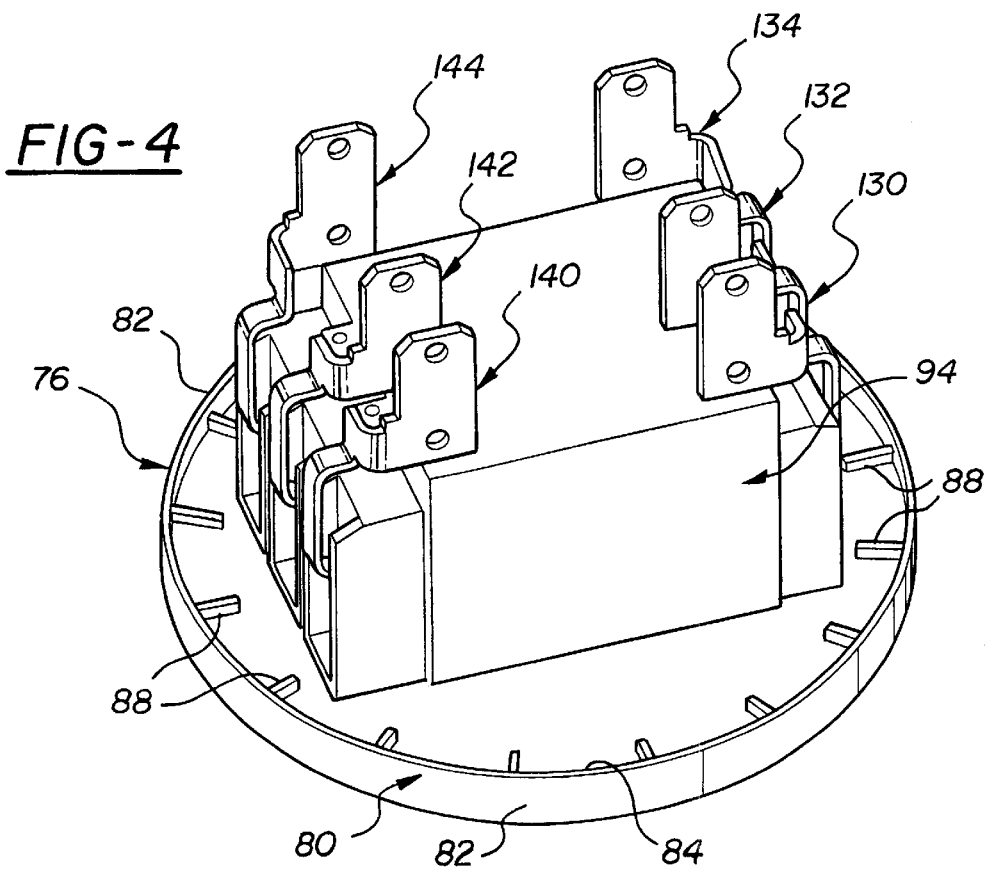

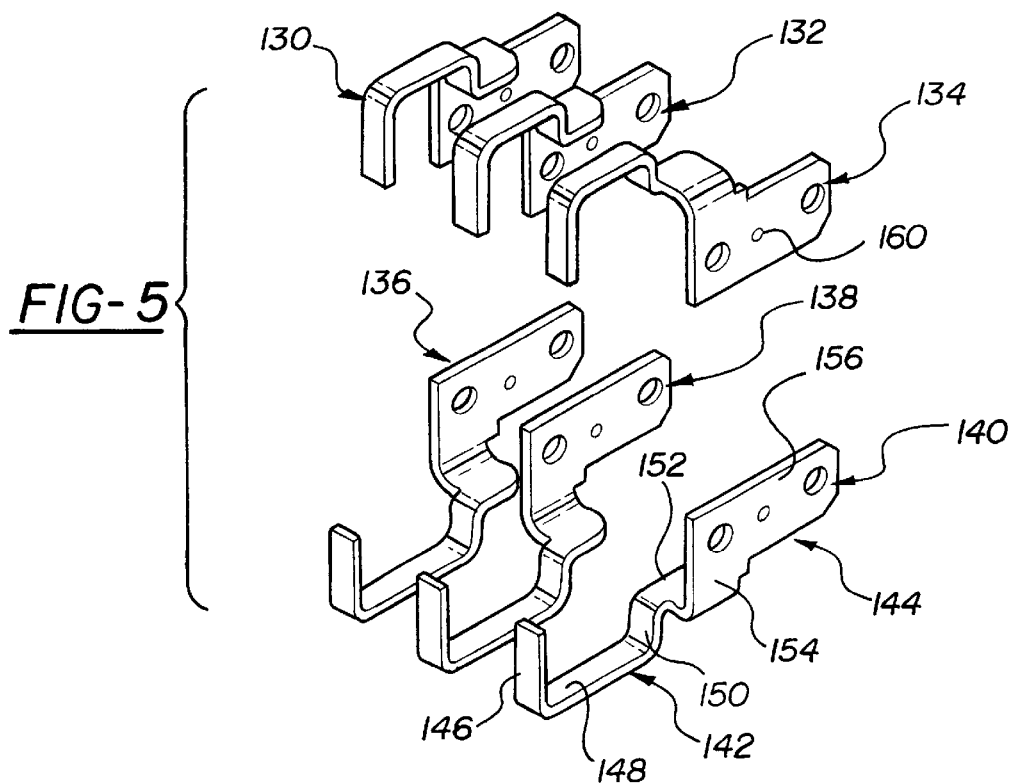
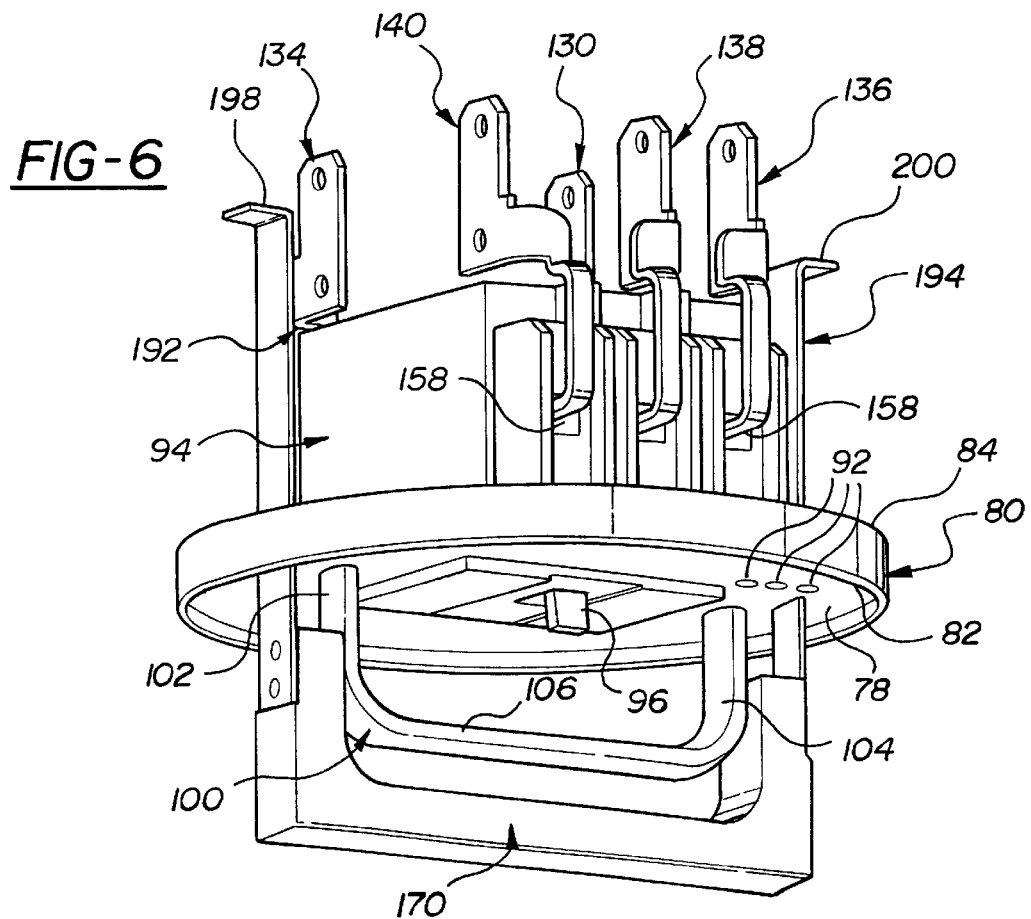

DISCONNECT WATTHOUR METER SOCKET ADAPTER

CROSS REFERENCE TO CO-PENDING APPLICATION

This application is a division of U.S. application Ser. No. 09/925,434, filed Aug. 9, 2001 now U.S. Pat. No 6,520,798, the contents of which is incorporated herein in its entirety.

BACKGROUND

The present invention relates, in general, to electric power service apparatus for controlling the supply of electrical power to homes and buildings and, more specifically, to watthour meters and watthour meter socket adapters mountable in watthour meter sockets at homes and buildings.

Electrical power is supplied to an individual site by external electrical power line conductors located above or below ground. In a conventional arrangement, electrical power line conductors are connected to contacts in a watthour meter socket mounted on a building wall. Electrical load conductors are connected to another set of contacts in the meter socket and extend to an electrical distribution network in the building. A watthour meter is connected into the contacts in the meter socket to measure the electric power drawn through the load conductors.

Due to the current trend toward the use of plug-in watthour meters, extender type socket adapters have been devised which allow the addition of equipment and features not originally intended for the electrical service. Such watthour meter socket adapters have been constructed as service limiting adapters and provided with power disconnect devices, such as circuit breakers or ground fault circuit interrupters, both for protecting the electrical'service as well as, in certain applications, to limit the amount of power supplied to the use site.

It is common in the electrical utility industry to frequently disconnect electrical service to a particular site. Such service disconnection can be for non-payment, seasonal usage, or rental units in high turnaround areas, such as college campuses, mobile home parks and apartments, etc. Typically, when it is desired to disconnect electrical service to a particular user site, a utility serviceperson goes to the particular site and removes the watthour meter. Another serviceperson must be sent out to re-install a watthour meter to reconnect service to the site. This sequence is labor intensive and, therefore, expensive.

Certain watthour meter sockets are provided with a hand-operated, clamp jaw bypass mechanism which enable a utility to easily bypass the meter by connecting the line conductors directly to the load conductors while the meter is removed for servicing or replacement. The lever clamp bypass mechanism includes a pivotal lever mounted within the socket housing. The lever moves jumpers or bypass conductors between a first position, when the lever is in a downward extending position, in which the bypass conductors are spaced from one pair of the line and load contacts and a second position, when the lever is in an upward extending direction providing a jumper or bypass path between one pair of line and load jaw contacts in the socket. The lever and jaw mechanism may also be provided with or be operative with a jaw clamp device, such as a spring loaded portion of the jaw contacts which securely bias the blade terminals of a watthour meter or meter socket adapter in the socket jaw contacts when the lever is in the first or down position and holds the jaw parts spaced apart when the lever is in the up position for removal or insertion of the meter from or into the jaw contacts.

The bypass jumpers are designed only to bypass the meter while testing or replacement of the meter takes place. The bypass jumpers are not designed to disconnect a load or to reconnect a load in the socket. Indeed, watthour meter sockets typically include a printed label which provides a warning not to use the bypass contacts to disconnect a load.

To properly disconnect a meter service, the main disconnect device must switch the load off. This switch, however, is not always accessible to the utility service person as it is usually mounted in a fuse or circuit breaker box inside of the building. Since the utility may be disconnecting the meter service when the power bill has not been paid, the customer will not usually cooperate with the utility service person and turn the power off himself. If the bypass jumpers are used to disconnect or reconnect the load, an arc can be generated between the jaw contacts and the bypass jumpers causing injury to the utility service person.

For safety purposes, primarily to prevent the watthour meter from being reinstalled into the socket jaw contacts when a load is connected to the load conductors in the building or home which receives power from the socket, a multi-step installation procedure has been developed and essentially has become a utility industry standard.

If the watthour meter is installed in the socket when the load conductors connected to the socket are connected to an active load in the home or building, arcing will occur between the meter blade terminals and the socket jaw contacts. Arcing creates an explosive event and gases, which are propelled out of the socket toward the utility serviceman, pose a significant injury potential to the utility serviceperson, as well as a fire hazard.

A prior art meter replacement and reinstallation procedure in a socket having a lever controlled set of jaw bypass contacts uses a conventional socket adapter base having internally mounted jaw contacts connected to blade terminals which project outwardly from the bottom wall of the base for engagement with the socket jaw contacts. The base jaw contacts receive mating blade terminals mounted on a similar base attached to the rear surface of a generally rectangular housing shown in FIG. 1. A one phase, two phase or three phase disconnect switch, having an externally movable lever, is mounted in the housing and has contacts connected between the housing base blade terminals. A handle is mounted on the top of the housing to facilitate installation and removal of the housing with the socket adapter base.

When a watthour meter is to be removed from the socket, the socket mounted bypass lever is moved to the up position. This disengages the blade clamping force from the socket jaw contacts, enabling the meter blade terminals to be easily removed from the socket jaw contacts, and at the same time, closes or electrically connects the bypass jumpers and the jaw contacts.

After the watthour meter has been removed from the socket, the disconnect housing is mounted in the socket adapter base, with the disconnect switch in the "ON" or current carrying position, to provide a closed circuit between the line and load jaw blades in the socket adapter base. The socket adapter base is then mounted in engagement with the socket jaw contacts. The bypass lever is then moved to the down position to open the bypass contacts and to clamp the base blades in the socket jaw contacts. Next, the disconnect switch is moved to the "off" position and the disconnect housing removed from the socket adapter base. The socket cover and a bladed adapter cover are then mounted to the socket. Lastly, a sealing ring in the case of a ring style socket is then mounted on the socket to seal off the socket and to complete the removal of a watthour meter from the socket.

When it is desired to reconnect a watthour meter in the socket, a reverse sequence is employed. The sealing ring, the socket cover and the adapter cover are first removed from the socket. With the disconnect switch in the "OFF" position, the disconnect housing is urged into engagement into the socket adapter base in the socket. The disconnect switch in the disconnect housing is the moved to the "ON" position.

The socket bypass lever is then moved to the up position bringing the bypass contacts into engagement with the socket jaw contacts. Since the disconnect switch had previously been moved to the "ON" position, any potential arcing caused by the slow, manual movement of the bypass contacts into engagement with the socket jaw contacts under an active load is prevented by tripping of the disconnect switch.

With the bypass jumpers engaged with the jaw contacts, both the disconnect housing and the adapter base can be removed from the socket. The watthour meter may then be easily installed into the non-clamped, socket jaw contacts. Next, the bypass lever is moved to the down position removing the bypass contacts from engagement with the socket jaw contacts and allowing the clamp jaw portions to move into secure, biased engagement with the meter blade terminals to securely hold the watthour meter in the socket. Finally, a socket cover and seal are used, as required.

Prior watthour meter bypass disconnects have been provided with printed instructions, usually on a separate card which specify the sequence of operation to remove a meter and to install the bypass disconnect in the socket. However, these devices did not provide both meter disconnect and meter reconnect sequences in a readily visible location for use by any utility service person without requiring a separate instruction card.

Prior meter disconnects have also been provided with lights, typically one for each load phase, which indicate if power is supplied to a load even though the disconnect switch is in the "off" position. Reconnecting a watthour meter into an active load creates the potential for dangerous arcing of the bypass contacts which are not designed to handle instantaneous high currents. However, when using such prior meter disconnect devices, it is up to the utility service person to remember to check the state of the lights at the prior sequence step during the meter disconnect and reconnect operations.

While this procedure and equipment, if properly used, minimizes the possibility of arcing and the explosive generation of gases which could damage the socket as well as possibly injure the service utility person, it is not without certain disadvantages. One problem is that the socket adapter base is not always clamped securely in the socket jaws when the socket bypass lever is moved to the down position during meter disconnect. If this occurs, the socket adapter base has a tendency to pull out of the socket with removal of the disconnect housing from the socket. It is then oftentimes difficult to separate the disconnect housing from the socket adapter base.

Another problem involves the handle on the disconnect housing, which has heretofore been mounted on the top of the housing. Installation and removal forces exerted on the disconnect housing through the handle have a tendency to be applied more through the top portion of the housing and not equally or directed across the front entire housing. This can lead to less than complete engagement of the disconnect housing blades in the socket adapter base jaw contacts.

Since the handle on the prior art disconnect housing has been mounted on top of the housing, the disconnect switch lever sticks out of the front of the housing. This places the disconnect switch lever in a position susceptible to damage during storage and transport of the disconnect housing to and from utility sites.

Thus, it would be desirable to provide a disconnect watthour meter socket adapter which facilitates easy removal and reinstallation of a watthour meter into and out of a watthour meter socket while minimizing the potential for injury to the utility serviceperson and damage to the watthour meter socket or disconnect if the bypass contacts are reconnected under load. It would also be desirable to provide a disconnect watthour meter socket adapter which is capable of diverting arcing gases generated during a meter disconnect or reinstallation away from the utility serviceperson to minimize the potential for injury to the utility serviceperson. It would also be desirable to provide a disconnect watthour meter socket adapter which has a more centralized mounting position of the handle for ease of removal of the disconnect housing from the socket adapter and even mounting force on the disconnect housing in the socket during a meter reconnect procedure. It would also be desirable to provide a disconnect watthour meter socket adapter which protects the disconnect switch lever from contact with external objects so as to minimize the potential for damage to the disconnect switch lever.

SUMMARY

The present invention is an electrical service apparatus in the form of a disconnect watthour meter socket adapter which facilitates the disconnection and reinstallation of a watthour meter into and out of a watthour meter socket.

In one aspect of the invention, an electrical service apparatus is mountable in an electrical socket having jaw contacts connected to electrical power line conductors and load distribution conductors. The apparatus includes a housing having a base, and an annular sidewall extending from the base. An electrical disconnect switch is mounted in the housing and has switchable contacts to selectively connect and disconnect the line conductors from the load conductors in the meter socket. A plurality of electrically conductive connectors are mounted through the base and have a first end extending outward from the base adapted for connection to the socket jaw contacts, and an opposed second end connectable to the electrical disconnect switch.

In another aspect of the invention, the electrical connectors are preferably in the form of rigid bus bars. This enables the connectors to fixedly support the disconnect switch in the housing without the need for additional fasteners or supports.

A cover is mounted on one end of the sidewall of the housing. An aperture is formed in the cover to open access to the movable lever on the disconnect switch.

In another aspect of the invention, at least one aperture is formed between the cover and the sidewall of the housing to permit gases caused by arcing of the bypass contacts in the socket from the housing and externally of the cover. In a specific aspect, a plurality of apertures formed between a plurality of radially extending, circumferentially-spaced ribs carried on the cover and engagable with one end of the sidewall of the housing. Preferably, a peripheral lip extends from the cover toward the base of the housing to direct gas flow through the apertures away from the cover and toward the base of the housing.

A primary handle is fixedly mounted to the housing. Preferably, the primary handle is mounted over a central lateral axis of the cover. The primary handle includes two spaced legs fixedly engaged on one end to the cover and a central leg extending between another end of the side legs and spaced from the cover. Preferably, the central legs are disposed over the disconnect switch lever as a protective shield.

In another aspect of the invention, the apparatus includes an ejector handle mounted for movement between first and second positions with respect to the cover. Ejector arms are connected to the ejector handle and extend through the cover and the housing to distal ends disposed exteriorly of the base of the housing. The distal ends of the ejector arms are movable with respect to the base of the housing upon movement of the ejector handle from the first position to the second position to separate the base of the housing from an attached, electrical component.

The ejector handle may be provided by itself on the cover or in combination with the primary handle wherein the ejector handle is normally biased to the first position in which a central leg of the ejector handle is spaced from a central leg of the primary handle.

According to another aspect of the present invention, the ejector handle may be used by itself or in combination with the primary handle on the cover or end wall of any socket mounted electrical apparatus, including watthour meters. In this aspect, the ejector handle with or without the primary handle may be mounted directly on the end wall of the apparatus cover, with the ejector arm or arms extending through the cover to distal ends projecting exteriorly of the base of the apparatus to separate the apparatus, such as a watthour meter, from the socket in which it is mounted.

In another aspect, the invention defines a method for removing and remounting an electrical watthour meter in a meter socket having jaw contacts connected to electrical power conductors. The method includes the sequential steps of:

removing a socket cover from a socket housing;

moving a socket contact bypass lever to a position connecting bypass contacts between socket line and load jaw contacts;

removing the watthour meter from the socket;

providing a disconnect housing having an electrical disconnect switch carrying switchable contacts connected to a plurality of connectors extending externally of the housing for connection to the socket jaw contacts;

moving an electrical disconnect switch control lever to a position placing the disconnect switch contacts in a closed position;

installing the disconnect housing in a base having jaw contacts receiving the external ends of the connectors on the disconnect housing and external terminals adapted to be engaged with the socket jaw contacts;

installing the disconnect housing and the base into the socket;

moving the socket contact bypass lever to a position moving the bypass contacts to an open position from the socket jaw contacts;

switching the electrical disconnect switch control lever to an off position opening the switchable contacts;

verifying that potential lights carried on the housing are all off, and removing the housing from the base.

In another aspect, the inventive method further includes the steps of replacing the socket cover on the socket housing; and installing a meter opening cover on the socket cover.

The method also includes the steps of reconnecting a watthour meter in a meter socket comprising the steps of:

verifying that a main disconnect in the load distribution network is in an off position;

removing the meter opening cover and the socket cover from the socket housing;

with the disconnect switch control lever in the off position, mounting the housing in the base in the socket;

verifying that the load side potential lights are off;

switching the disconnect switch control lever to the on position;

moving the socket contact bypass lever to a closed position closing socket bypass contacts to connect the socket line contacts to the socket load contacts;

removing the housing and the base from the socket;

installing a watthour meter in the socket jaw contacts;

moving the socket contact bypass to a position disconnecting the socket bypass contacts from the socket jaw contacts; and replacing the socket cover.

The present invention provides several advantages over previously devised electrical apparatus using a disconnect switch for meter disconnection and reconnecting. First, the gas apertures or ports formed between the cover and the sidewall of the adapter housing uniquely provide an escape gas flow path for arcing gases generated if the bypass contacts are moved to a closed position while an active load is connected to the load conductors. The arc gasses are directed away from the cover toward the base of the housing, thereby minimizing the potential for injury to the utility serviceperson normally positioned in close proximity to and facing the cover.

The present invention also provides the rigid bus bar connectors to both electrically connect the switchable contacts of the disconnect switch to the socket jaw contacts in the socket and, also, to fixedly mount the disconnect switch within the housing without the need for additional fasteners. This simplifies assembly of the present apparatus and reduces material and assembly costs.

Further, the present apparatus includes a laterally centrally located handle which centralizes insertion and pullout forces through the handle on the socket adapter. This reduces the magnitude of push-in or pullout force required to install or remove the disconnect switch adapter in a meter socket.

The present apparatus also includes a unique ejector handle, usable by itself or in combination with the primary handle. The ejector handle includes movable ejector arms which are extendable from the base of the adapter housing to assist in separating the adapter housing from an attached electrical component, such as a socket mounting base used during the meter disconnect and reconnect sequence.

BRIEF DESCRIPTION OF THE DRAWINGS

The various features, advantages and other uses of the present invention will become more apparent by referring to the following detailed description and drawing in which:

FIG. 2 is a perspective view of a disconnect watthour meter socket adapter according to the present invention;

FIG. 4 is a rear perspective view of the cover and disconnect adapter shown in FIG. 2;

FIG. 5 is an exploded perspective view of the disconnect adapter connectors shown in FIG. 4;

FIG. 6 is a perspective view of the disconnect adapter, with the cover removed for clarity;

DETAILED DESCRIPTION

Figure 1:
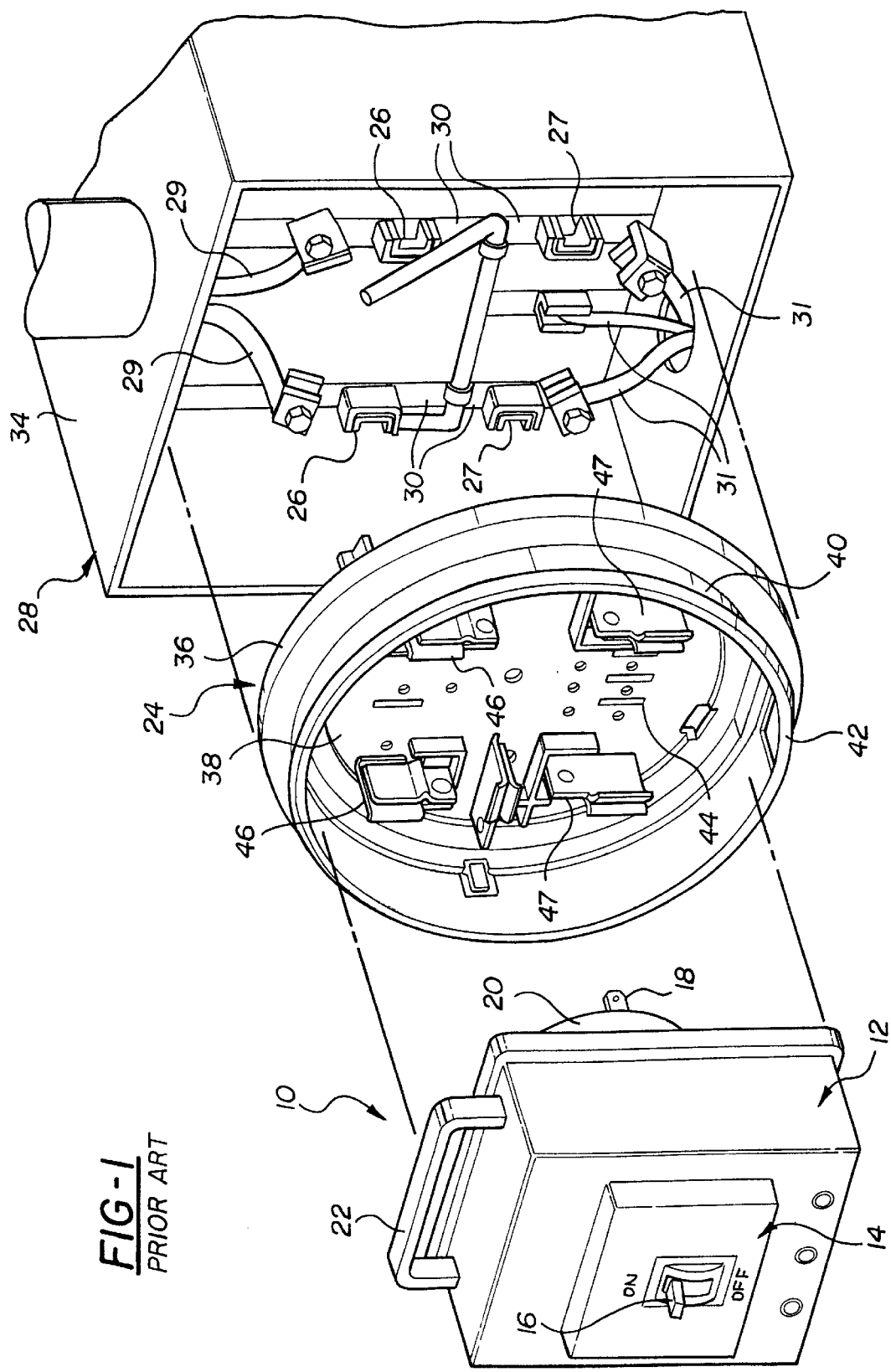
FIG. 1 is an exploded perspective view of a prior art, disconnect watthour meter socket adapter usable with a mounting base and a watthour meter socket.

For clarity in understanding of the unique features of the disconnect watthour meter socket adapter, a prior art disconnect watthour meter socket adapter is shown in FIG. 1 along with a mounting base and watthour meter socket as described in the background section of this application. The disconnect housing is an Ekstrom Industries, Inc., disconnect watthour meter socket adapter housing, Model No.1000,SP-3542. In general, the prior art disconnect watthour meter socket adapter 10 shown in FIG. 1 includes a housing 12 having a circuit breaker or disconnect switch 14 mounted therein. The disconnect switch 14 is, for example, a two hundred amp circuit breaker having internal contacts which switch between open and closed positions, depending upon an over-amperage detection circuit built into the disconnect switch 14, as well as the position of a control lever 16 which is movable between a "ON" position corresponding to a closed contact position and a "OFF" position corresponding to an open contact position.

The disconnect contacts, not shown, are connected to blade terminals, with only one blade terminal 18 being depicted in FIG. 1. The blade terminals 18 are mounted in an annular base 20, similar to the base of plug-in watthour meter socket adapters. A handle 22 is fixedly mounted on the housing 12, generally to a top surface to facilitate the installation and removal of the socket adapter 10 into and out of a mounting base 24 which is in turn mounted to the jaw contacts 26 and 27 in a watthour meter socket 28.

The disconnect watthour meter socket adapter 10 is typically employed with a meter socket 28 having a plurality of movable bypass contacts 30 the position of each of which is controlled by a pivotal lever 32 mounted internally within the housing 34 of the socket 28. The lever 32, when in a down position, moves the bypass contacts 30 to a first open position wherein the bypass contacts 30 are spaced from contact with the socket jaw contacts 26. When the lever 32 is pivoted to the up position, the bypass contacts 30 are moved to a second position wherein the bypass contacts 30 are connected to certain of the socket jaw contacts 26, connecting one line connected jaw contact to one load connected jaw contact in the socket.

In addition, such lever actuated bypass contact mechanisms also provide for a clamping force on the socket jaw contacts 26 to securely retain any blade terminals, such as the blade terminals on the mounting base 24 or on a watthour meter, not shown, mounted therein. The clamping mechanism, typically, a movably biased portion of the jaw contact, is urged by the bypass contact 30 to a wider jaw open position when the lever 32 moves to the up position to release the clamping force of the jaw contact on an inserted blade terminal and to allow insertion or removal of a watthour meter or a watthour meter socket adapter into and out of engagement with the socket jaw contacts 26.

The mounting base 24 can be any conventional watthour meter socket adapter or socket adapter base, such as the low profile socket adapter shown in U.S. Pat. Nos. 5,997,347 and 6,152,764 which are assigned to Ekstrom Industries, Inc., the Assignee of the present invention.

As is known, the mounting base or socket adapter 24 includes an annular flange 36 surrounding a bottom wall 38. A sidewall 40 projects from the flange 36 to an outer mounting edge 42. A plurality of apertures 44 are formed in the bottom wall 38 and receive jaw blades 46 which are mounted in the bottom wall 38 and include a blade terminal portion projecting exteriorly of the bottom wall 38 for engagement with the socket jaw contacts 26 in the socket 28. The jaw portions of the jaw blades 46 receive the blade terminals 18 on the prior art disconnect watthour meter socket adapter 10 shown in FIG. 1.

The sequence of operation of installing and removing the disconnect watthour meter socket adapter 10 has been described previously. While this disconnect watthour meter socket adapter 10 and its installation and removal method has proven effective, it is believed that further improvements can be made to facilitate the use of such a disconnect watthour meter socket adapter, to improve its safe use, as well as to reduce its manufacturing costs.

Referring now to FIGS. 2–12, there is depicted several aspects of a disconnect watthour meter socket adapter 60 according to the present invention. Both aspects share a generally similar housing 62 formed of a bottom wall 64 shown in FIG. 3, a sidewall 66 extending from the bottom wall 64 and terminating in a radially outward projecting mounting flange 68 at an outer end, and an enlarged flange 70 extending radially outward from the end of the sidewall 66 opposite the mounting flange 68 in the general vicinity of the bottom wall 64.

The sidewall 66 may be fixedly joined by fasteners to the bottom wall 64 or integrally and unitarily formed with the bottom wall 64 as a one-piece molding.

The housing 62 is formed of a suitable electrically insulating material, such as polycarbonate. Other insulating materials, which are easily moldable, may also be employed.

A plurality of mounting feet 72 are provided on an outer surface of the bottom wall 64, as shown in FIG. 2, as is known in a watthour meter socket adapter. One mounting foot 72 is provided adjacent to each outwardly extending blade terminal as described hereafter.

A cover 76 is mounted on the housing 62 as described hereafter. The cover 76 is formed of an electrically insulating material, such as polycarbonate. The cover 76 includes a central wall 78 of generally annular form.

Figure 13:
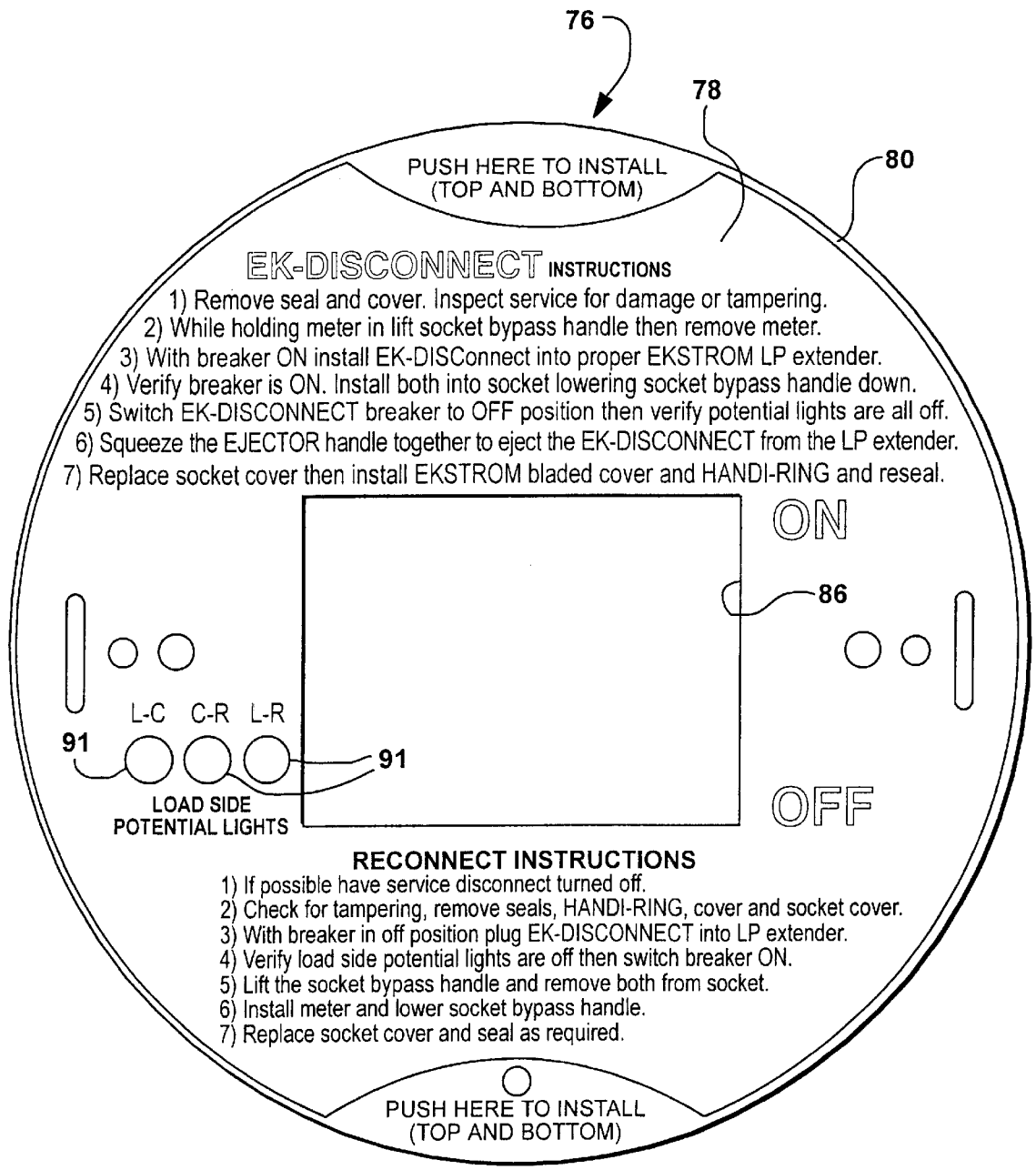
FIG. 13 is a front elevational view of a preferred aspect of the cover.

A plurality of apertures, such as apertures 91 shown in FIG. 13, are formed on the central wall 78 and receive or open visible access to light sources, such as LEDs or light bulbs, mounted within the housing 62. Each light source 92 is connected to one of the load jaw blades which are described hereafter.

FIG. 13 also shows printed indicia which is applied to the exterior surface of the central wall 78 of the cover 76. The indicia is in two parts, namely instructions for meter disconnect and instructions for meter reconnect. The indicia provides additional safety for the disconnect watthour meter socket adapter 10 of the present invention by clearly providing a step-by-step process for safe meter disconnect and reconnect.

Figure 8:
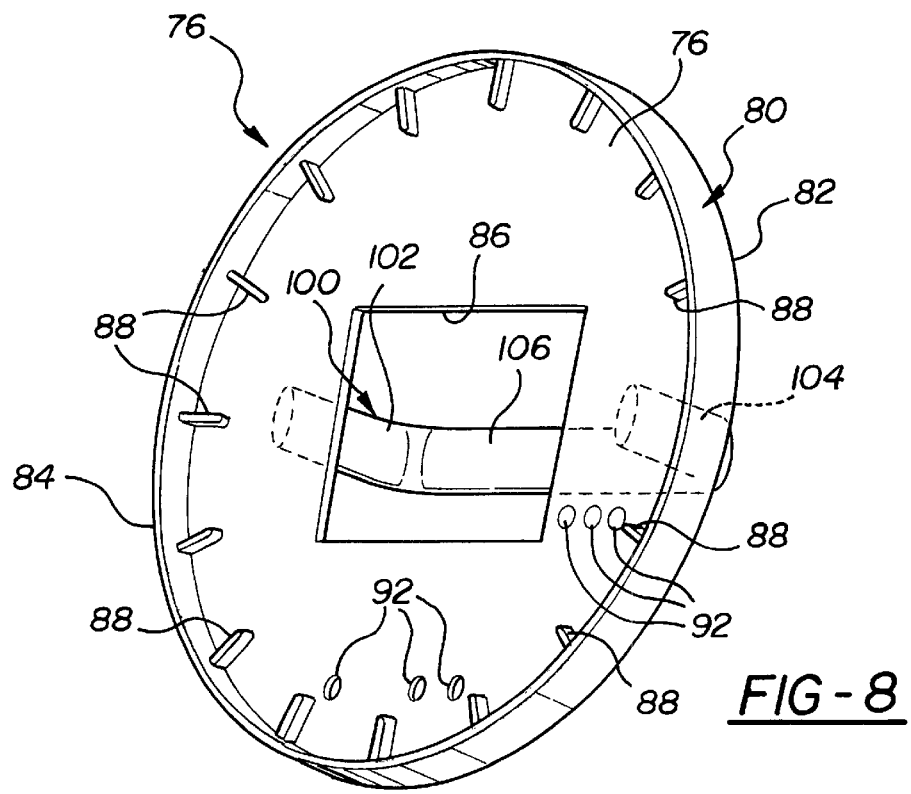
FIG. 8 is a rear perspective view of the cover of the disconnect watthour meter socket adapter of the present invention shown in FIG. 4.

A peripheral flange 80 is unitarily joined to the peripheral edge of the central wall 78, such as by molding. The flange 80 includes first and second spaced ends 82 and 84, which are spaced from opposite sides of the central wall 78 as clearly shown in FIG. 9. As shown in FIGS. 4 and 8, a plurality of ribs or spacers 88 are mounted on the inner surface of the central wall 78, generally at the joint between the peripheral flange 80 and the inner surface of the central wall 78. The ribs 88 have a generally polygonal configuration and project radially inward a short distance from the peripheral flange 80.

Figure 9:
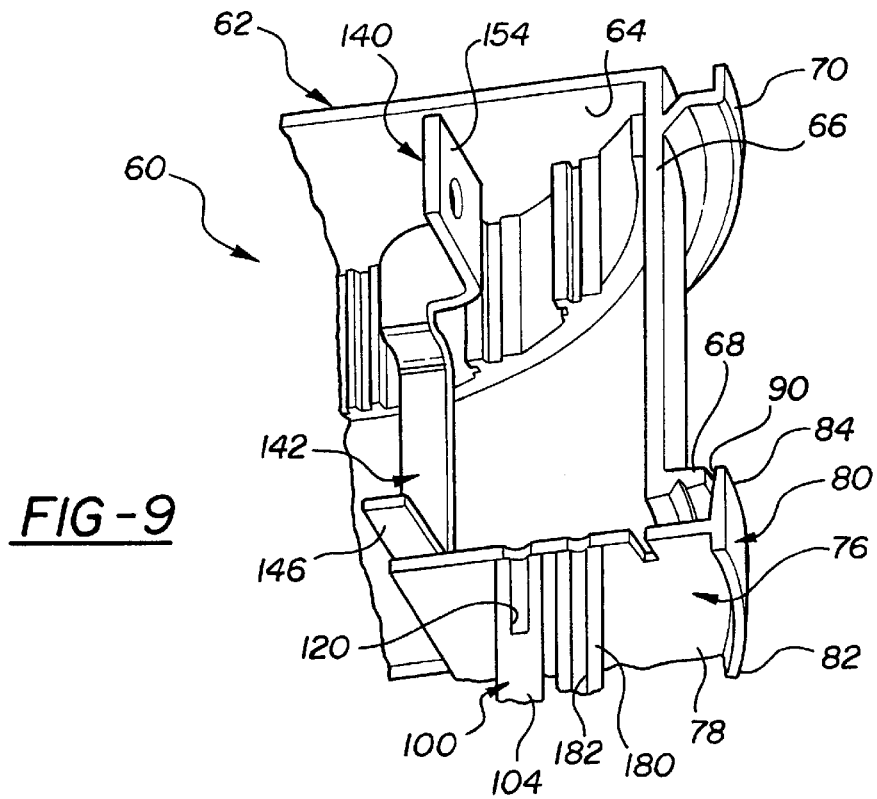
FIG. 9 is a partial, enlarged perspective, broken-away view showing the degassing apertures between the cover and the sidewall of the disconnect adapter housing.

The ribs 88 are positioned to seat on the outer mounting flange 68 of the sidewall 66 of the housing 62. Further, the diameter of the central wall 78 and the peripheral flange 80 on the cover 76 are selected such that the second or innermost end 84 of the peripheral flange 80 of the cover 76 is spaced from the radially outer edge of the mounting flange 68 of the sidewall 66 by a short distance or gap 90 as shown in FIG. 9. This gap 90 communicates with the spaces or apertures formed between the circumferentially spaced ribs 88 so as to form a flow path between the interior of the housing 62 and the ambient atmosphere. This flow path is designed to convey any gasses generated during arcing of the contacts in the disconnect, described hereafter, mounted within the housing 62 out of the housing 62 to avoid an explosion within the housing 62, as well as rearward toward the back wall of the socket 28. This forms a number of degassing openings or ports through the gaps 90 about the circumference of the cover 76 so as to direct any arcing gasses generated by the disconnect within the housing 62 away from the utility serviceperson who is normally standing close to and facing the front of the socket adapter 60.

Figure 3:
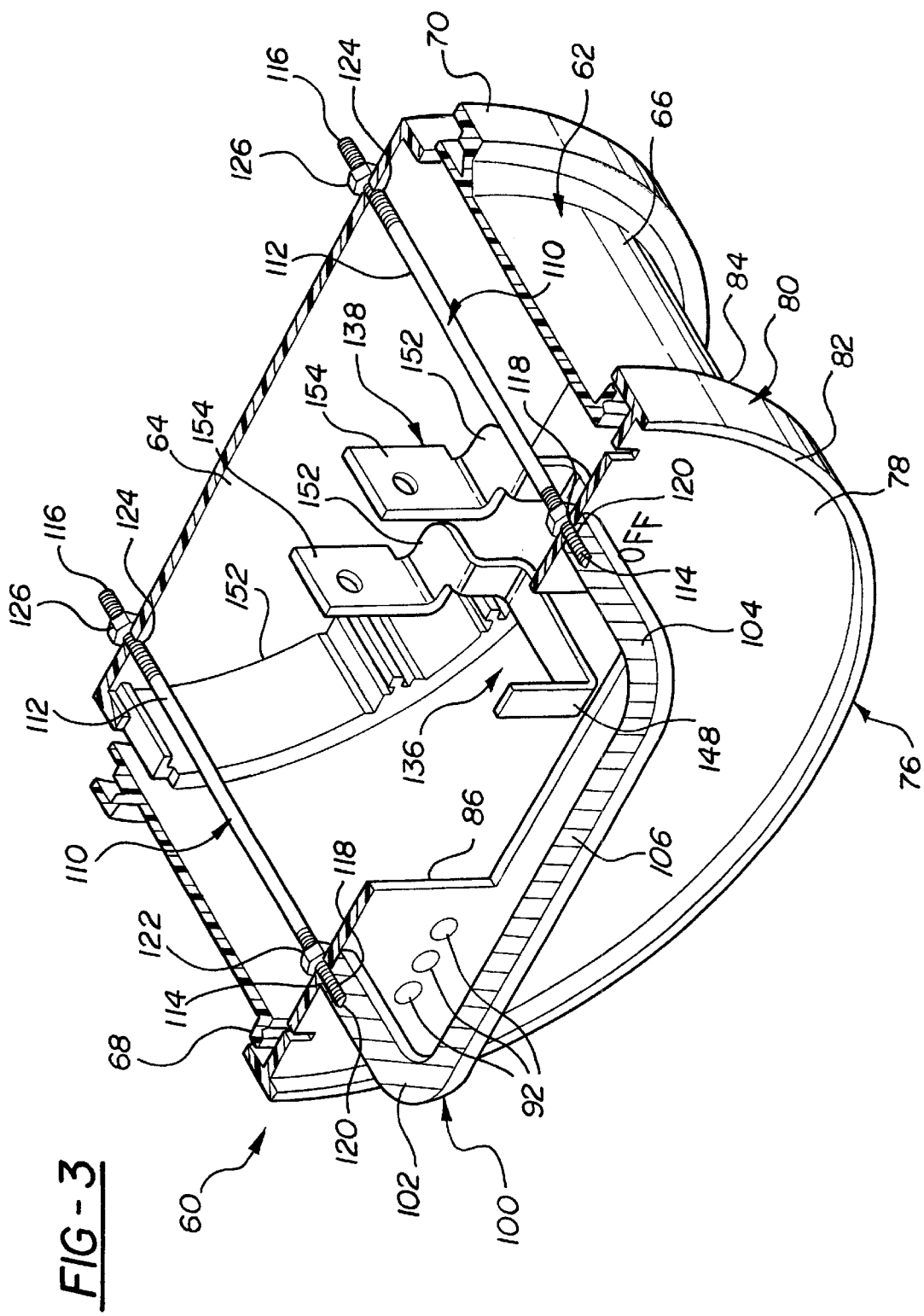
FIG. 3 is a cross-sectional view generally taken along line 3—3 in FIG. 2.
Figure 7:
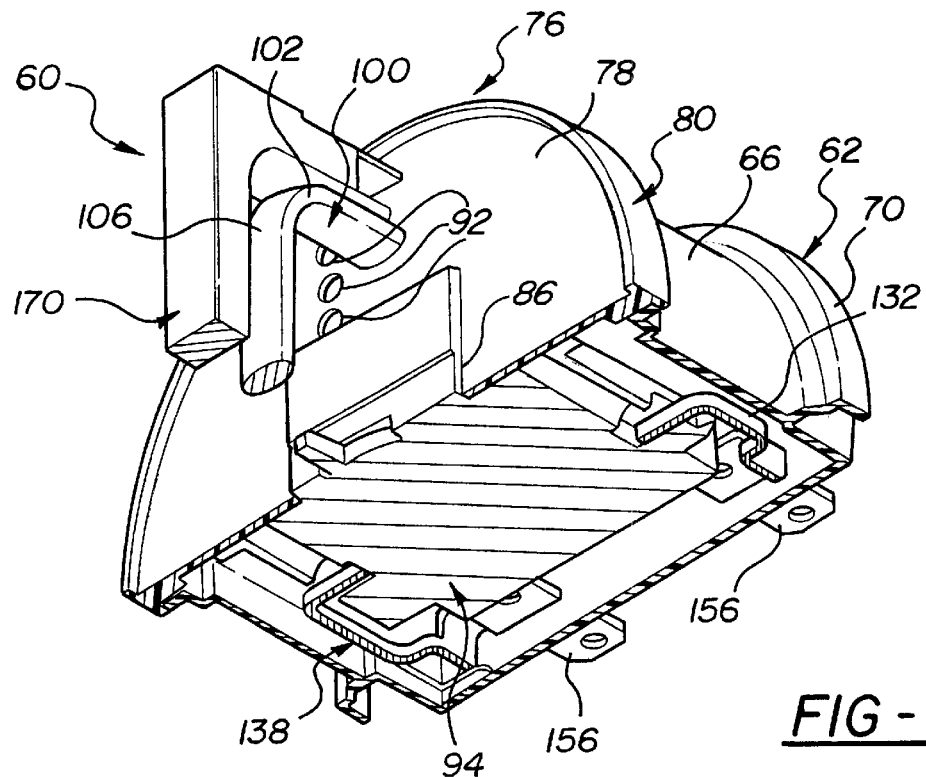
FIG. 7 is a perspective, lateral, cross-sectional view of the complete disconnect watthour meter socket adapter shown in FIG. 2.

Referring to FIGS. 2, 3 and 8, an aperture 86 is formed in the central wall 78 of the cover 76 allowing a control switch or lever 96 of a conventional electric disconnect switch or circuit breaker 94 to be exposed therethrough. The disconnect switch 94 is preferably a three-pole, one hundred amp, 480 volt circuit breaker sold by Cutler Hammer as Model No. GD 3100. This circuit breaker has an interrupting rating of 65,000 amps at 240 volts and 22,000 amps at 480 volts. These circuit breaker ratings are given by way of example only, as circuit breakers or disconnect switches having other ratings, as well as single pole or two pole circuit breakers or disconnect switches, may also be employed in the socket adapter 62.

The control lever or switch 96 is mounted on the body of the disconnect switch 94 and projects through the aperture 86 in the central wall 78 of the cover 76 so as to be accessible exteriorly of the cover 76. The control lever or switch. 96 is movable between a first "ON" position corresponding to a closed contact position of the disconnect switch contacts, and a second "OFF" position corresponding to an open position of the disconnect switch contacts. The control lever 96 automatically switches from the first "ON" position to the second "OFF" position upon tripping of the disconnect switch 94 when the magnitude of the current through the disconnect switch 94 exceeds the amp rating of the disconnect switch.

As is also known, the control lever 96 may also be manually moved between the first and second positions to reactivate the disconnect switch 94 after it has tripped or to deactivate the disconnect switch 94.

The mounting of the disconnect switch 94 through the cover 76 and within the housing 62 of the socket adapter 60 will be described in greater detail hereafter.

As shown in FIGS. 2, 3, 6–12, a handle 100, hereafter alternately referred to as a first or primary handle 100, is mounted to the housing 62 and/or the cover 76. The handle 100 includes a pair of spaced side legs 102 and 104 which are integrally joined at one end by a central end leg 106. The side legs 102 and 104 space the central leg 106 away from the central wall 78 of the cover 76.

It is important to note that in the present socket adapter 62, the handle 100 is positioned centrally on the central wall 78 of the cover 76 along a lateral center axis. In this position, the central leg 106 of the handle 100 is spaced from, but generally overlies the control lever or switch 96 on the disconnect 94, exposed through the aperture 86 in the cover 76. The handle 100 thus not only facilitates installation or removal of the socket adapter 62 into and out of the mounting base 24 shown in FIG. 1, and as described hereafter, but also provides protection for the disconnect control lever 96 to prevent inadvertent contact with and movement of the control lever 96 except when such movement is intended by a utility serviceperson or by tripping of the disconnect 94.

The central mounting location of the handle 100 also insures that the socket adapter 62 is pulled straight out of the mounting base 24 such that any removal force is directly applied to separating the housing 62 and/or the mounting base 24 from the socket 28. This results in a lower removal force as compared to the top mounted and offset handle position of the prior art socket adapter 10 shown in FIG. 1.

Although the handle 100 could be mounted to the cover 76 and/or the housing 62 in a number of different ways, in a preferred example of a mounting arrangement, a pair of fasteners, each denoted by reference number 110, include an elongated shank 112 having oppositely threaded ends 114 and 116. The threaded ends 114 extend through apertures 118 in the cover 76 and threadingly engage with internally threaded bores 120 formed in the side legs 102 and 104 of the handle 100. A lock nut 122 is optionally provided adjacent the inner surface of the cover 76 for locking one end of the fastener 110 to the cover 76 and to prevent over threading of the fastener 110 which could deform the cover 76.

Referring now to FIGS. 3–7, there is depicted a plurality of connectors or conductors which are used to electrically connect the disconnect switch 94 to the line and load jaw contacts in the socket 28. The line connectors for the three-phase socket adapter 60 of the present invention are shown by reference numbers 130, 132, and 134. Load connectors or conductors are depicted by reference numbers 136, 138, and 140.

All of the conductors 130, 132, 134, 136, 138, and 140 are formed of an electrically conductive material, such as tin plated copper, and have a bus bar configuration of either rectangular or polygonal cross section. This construction eliminates stranded wire conductors which can come loose from the disconnect switch 94 or jaw contacts 26.

Although mounted in different orientations and connected to different socket jaw contacts 26, all of the line and load connectors 130, 132, 134, 136, 138 and 140 have only two configurations. For example, line connectors 130 and 132 are identical in configuration to the load connector 140. Similarly, the line connector 134 is identical to the load connectors 136 and 138. Further, the connectors 130, 132, and 140 are mirror images of the connectors 134, 136, and 138.

Each of the connectors, such as connector 140, is formed with a first end portion 142 and a second end portion 144. The first end portion 142 includes an end flange 146 which is bent at an angle, preferably perpendicular, from an arm portion 148. An offset portion 150 connects the arm 148 to a central pad 152. The second end portion 144 extends from the central pad 152 at an angle, also preferably perpendicular. The second end portion 144 includes a connector 154 extending from the pad 152 and a terminal end portion 156 which functions as a blade terminal and is designed to slide into engagement with one of the socket jaw contacts 26.

The end flange 146 of each of the connectors 130, 132, 134, 136, 138, and 140 is configured and oriented to slide into engagement with a terminal 158 in FIG. 6 on the disconnect switch 94. A suitable connector, such as a screw fastener, snap clamp, may be used to securely fix the end flange 146 in the terminal 158. The other connectors 130, 132, 134, 136 and 138 are similarly connected at their respective end flanges 146 to other terminals on the disconnect switch 94.

In this orientation, the terminal ends 156 of each of the connectors 130, 132, 134, 136, 138 and 140 extend perpendicular to the opposed end flanges 146 and slide through the apertures in the bottom wall 64 of the socket adapter housing 62 to form a blade terminal which is engagable with one of the jaw contacts 26 in the mounting base.

As shown in FIGS. 3–7, each conductor 130, 132, 134, 136, 138, and 140 has an aperture 160 in an intermediate portion of the second end 144. This aperture 160 is disposed closely adjacent to the outer surface of the bottom wall 64 of the housing 62 and receives a fastener, such as a cotter pin, not shown, to securely mount each conductor 130, 132, 134, 136, 138, and 140 in a fixed position relative to the bottom wall 64. This mounting arrangement, in combination with the rigid bus bar configuration of each of the conductors 130, 132, 134, 136, 138, and 140 also serves to fixedly mount the disconnect switch 94 in the housing 62, with an upper end, opposite from the terminals 158 disposed within the aperture 86 in the central wall 78 of the cover 76. No additional fasteners or mounts are needed to secure the disconnect switch 94 in position in the housing 62. This reduces manufacturing time and cost.

Referring now to FIGS. 6, 7, and 9–11, there is depicted an optional ejector handle 170 which may be employed to eject or separate the mounting base 24 from the socket adapter 62 after the mounting base 24 and socket adapter 62 have been removed from the socket 28. As described above, it is common for the mounting base 24 to remain engaged with the blade terminals on the socket 62 when the socket adapter 62 is pulled from the socket 28 for reinstallation of a watthour meter in the socket 28. Due to jaw contact retention forces, it is difficult to separate the mounting base 24 from the socket adapter 62 without the potential for damage to the mounting base 24 or the socket adapter 62.

The provision of the ejector handle 170 is designed to prevent the occurrence of damage and to simplify the separation of the mounting base 26 from the socket adapter 62. First, it will be understood that, although the optional ejector handle 170 has been depicted in several figures of the drawing, the first or primary handle 100 can be employed by itself in all configurations shown in the various drawing figures. Likewise, the ejector handle 170 can be employed in all of the aspects of the invention shown in the various figures.

Figure 11:
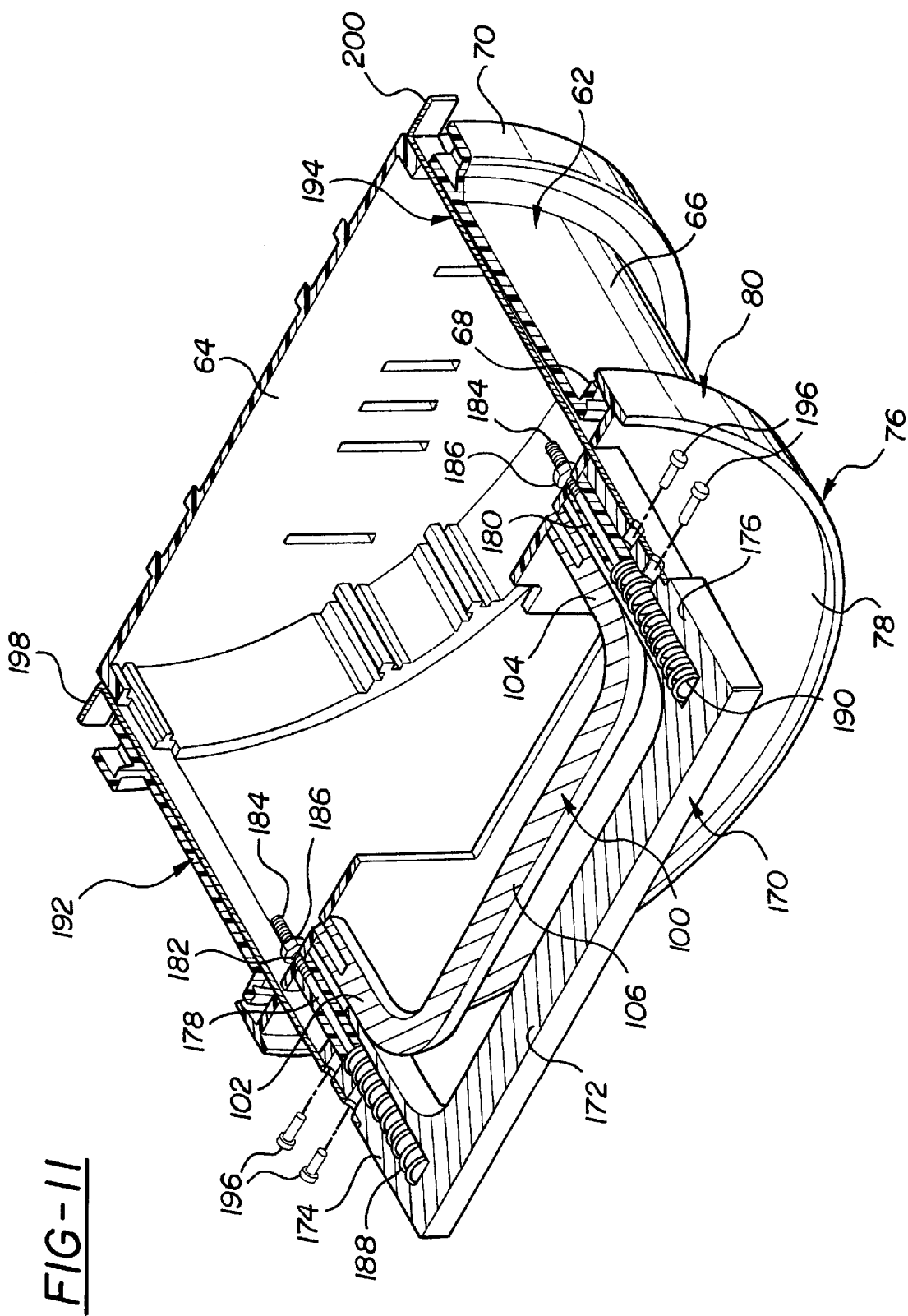
FIG. 11 is a perspective cross-sectional view generally taken along line 11—11 in FIG. 10.

As shown in FIG. 11, for example, the ejector handle 170 is formed with a central leg 172 which is connected at opposite ends to a pair of spaced side legs 174 and 176. The central leg 172 has a length slightly longer than the overall length of the first or primary handle 100, including the central leg 106 and the two side legs 102 and 104 of the handle 100, to enable the side legs 174 and 176 of the ejector handle 170 to be disposed adjacent to and laterally outward of the side legs 102 and 104, respectively, of the first or primary handle 100. A pair of standoffs 178 and 180 of generally tubular form are provided to extend from the central wall 78 of the cover 76 as shown in FIG. 11. Each standoff 178 and 180 includes a central threaded bore 182 which receives a fastener 184 to mount each standoff 178 and 180 on the central wall 78 of the cover 76. A lock nut 186 may be provided on each fastener 184 to lock the standoffs 178 and 180 in position. The upper end of each standoff 178 and 180 forms a seat for a coil spring 188 and 190, respectively, which are disposed in hollow bore portions in each of the side legs 174 and 178 of the ejector handle 170. The springs 188 and 190 normally bias the side legs 174 and 176 and the central leg 172 of the ejector handle 170 outward from the cover 76 to the normal, inoperative position shown in FIG. 11.

At least one and preferably a pair of ejector arms 192 and 194 extend through aligned apertures in the central wall 78 of the cover 76 and the bottom wall 64 of the socket adapter housing 62. One end of each ejector arm 192 and 194 is secured by means of fasteners, such as rivets 196, to a side portion of the ejector handle side legs 174 and 176, respectively.

Figure 12:
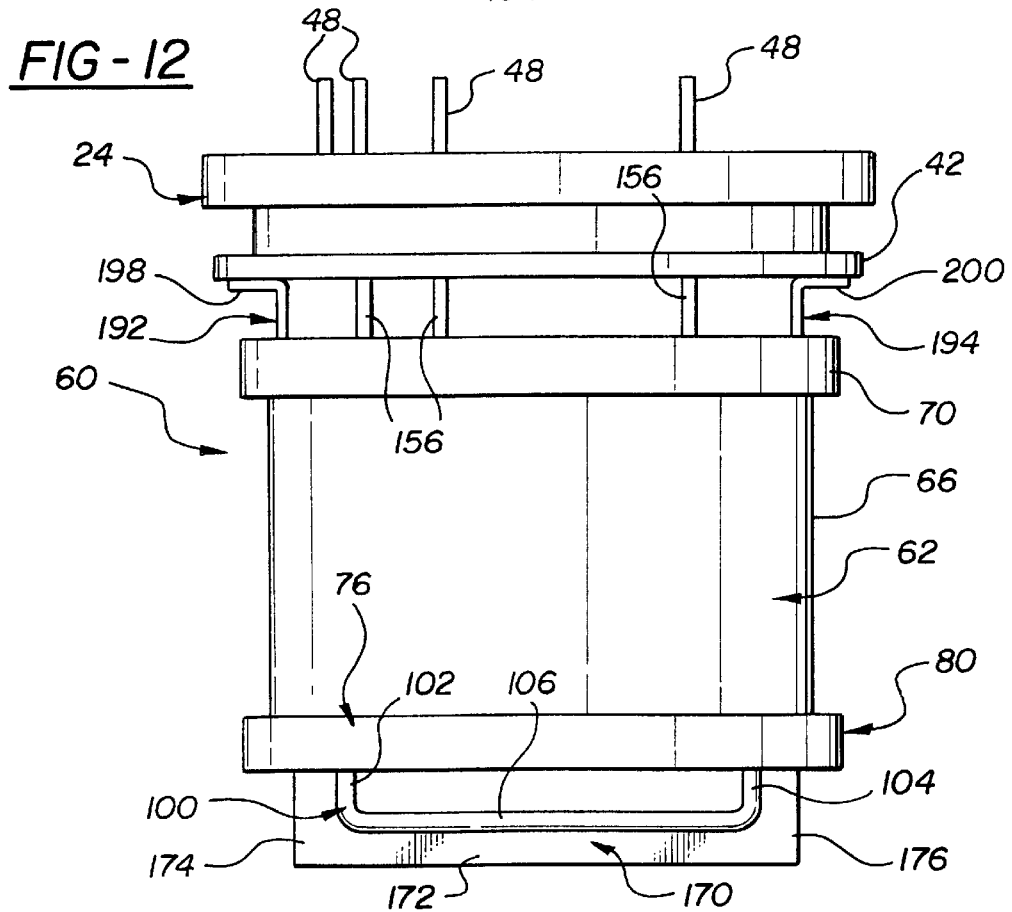
FIG. 12 is a top plan view of the disconnect watthour meter socket adapter depicted in FIGS. 10 and 11 and showing the separation of the mounting base from the disconnect socket adapter.
Figure 10:
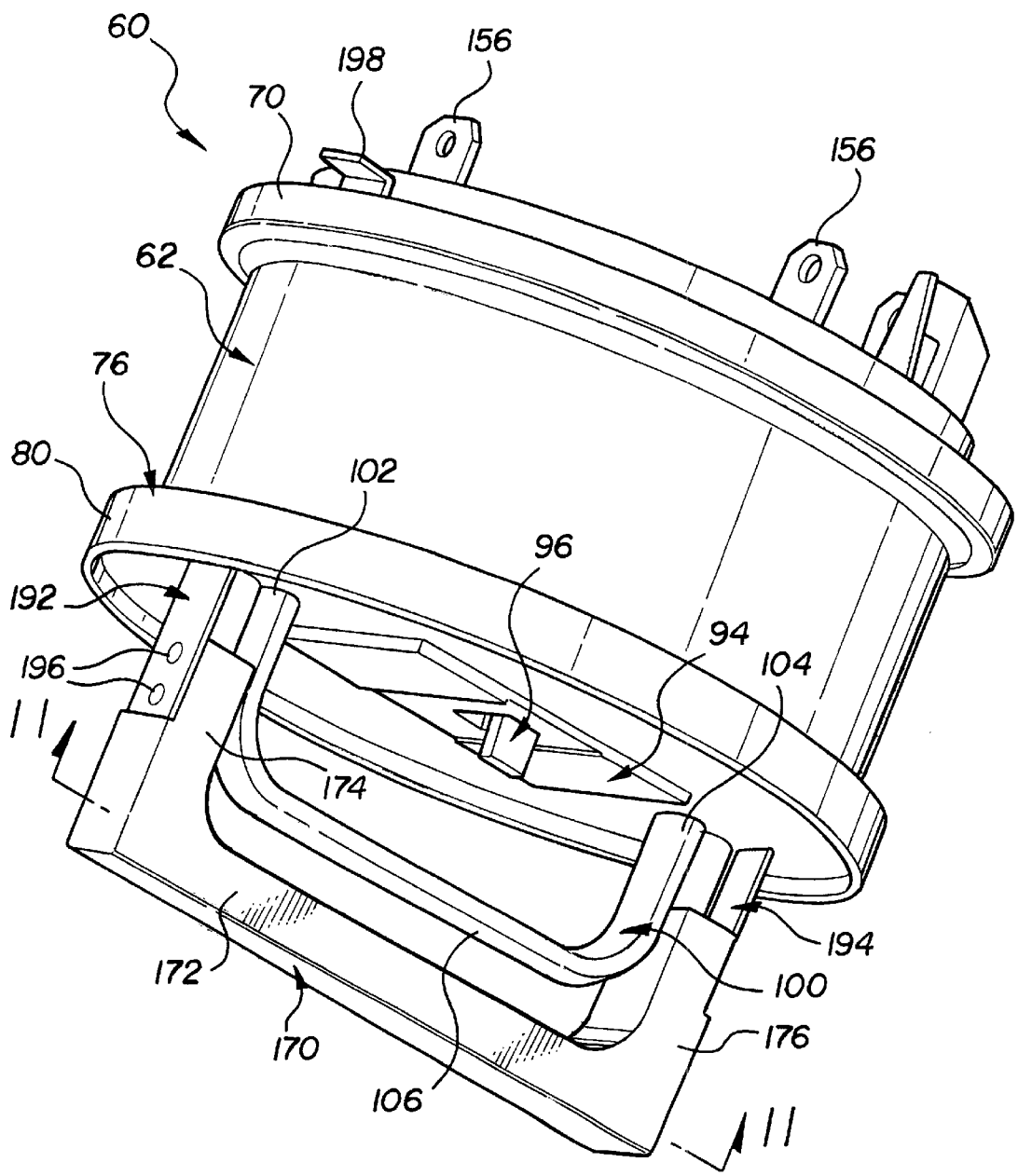
FIG. 10 is a perspective view of an alternate aspect disconnect watthour meter socket adapter.

The distal ends 198 and 200 of each ejector arm 192 and 194, respectively, are disposed at an angle, such as perpendicular, to the remainder of each ejector arm 192 and 194 to act as surfaces which are disposed adjacent to the outer mounting edge or flange 42 on the mounting base 24 as shown in FIG. 12.

In a normal, inoperative position shown in FIG. 11, the central leg 172 of the ejector handle 170 will be spaced from the central leg 106 of the first or primary handle 100. In this position, the distal ends or flanges 198 and 200 of the ejector arms 192 and 194, respectively, will be disposed substantially in line with the bottom wall 64 of the socket adapter housing 62.

When it is desired to separate the mounting base 24 from the socket adapter 60, a utility serviceperson merely has to grasp the central leg 106 of the first or primary handle 100 and the central leg 172 of the ejector handle 170 and squeeze the two handles 100 and 170 together until the central leg 172 of the ejector handle 170 abuts the central leg 106 of the first or primary handle 100 as shown in FIG. 12. This corresponds to the eject position. Movement of the ejector handle 170 toward the first or primary handle 100 causes the ejector arms 192 and 194 to slide through the aligned apertures in the cover 76 and the bottom wall 64 of the socket adapter housing 62 to thereby force the distal ends or flanges 198 and 200 of the ejector arms 192 and 194 against the outer mounting flange 42 and urge the mounting flange 42 away from the bottom wall 64 of the mounting base 24 until the jaw contacts in the mounting base 24 separate from the blade terminals extending outward from the bottom wall 64 of the socket adapter housing 62. Even if the mounting base 24 is not completely separated from the socket adapter housing 62 at full extension of the ejector arms 192 and 194 relative to the socket adapter housing 62, a sufficient length of the blade terminals in the socket adapter housing will have been separated from the corresponding jaw contacts in the mounting base 24 to enable only a small additional force to be need to completely separate the mounting base 24 from the socket adapter 60.

The ejector handle 170, described above, may also be used by itself or in combination with the primary handle 100, also described above, on other electrical apparatus which are mounted in a socket to simplify the disconnection of such apparatus from the meter socket. For example, the ejector handle 170 and primary handle 100 may be devised as described above and shown in FIGS. 10 and 11 on the end wall of the dome or cover of a watthour meter. In this application, the ejector arms 192 and 194, each having a distal end or flange 198 and 200, respectively, will extend through the interior of the meter cover and the meter base so that the flanges 198 and 200 are disposed exteriorly of the meter base for engagement with the meter socket standoffs, in the case of a ringless watthour meter socket, or with the socket cover mounting ring in the case of the ring-style meter socket cover. In the latter application, the end flanges 198 and 200 of the ejector arms 192 and 194 may be disposed in a shallow recess formed on the base of the watthour meter or in the socket cover mounting ring so as not to interfere with the watthour meter base mounting ring to socket cover mounting flange connection.

The use of the socket adapter 60 with the mounting base 62 and the socket 28 is the same as that described above in the background section of this application. During such use, the centrally mounted handle 100 on the socket adapter 60 reduces the amount of force required to insert and remove the socket adapter 60 to and from the mounting base 24 as well as to and from the socket 28. At the same time, the manufacturing cost of the socket adapter 60 has been reduced from previous disconnect watthour meter socket adapter designs due to the use of substantially identical disconnect connectors or conductors which also serve the function as acting as blade terminals for insertion into the mounting base draw contacts as well as to mount the disconnect switch within the socket adapter housing without the need for additional assembly steps or mounting devices.

One important feature provided by the disconnect watthour meter socket adapter 60 of the present invention is safety. The degassing apertures or gaps 90 formed between the cover 76 and the sidewalls 66 of the socket adapter housing 62 allow any arcing gasses generated when the disconnect switch 94 is tripped to the "ON" position, when a load is still connected to the load conductors in the socket 28, to be allowed to escape from the interior of the socket adapter housing 62 and be diverted away from the utility serviceperson who is standing immediately adjacent to the socket adapter 60. This minimizes the potential for danger to the utility serviceperson caused by explosion of the socket adapter housing or the arcing gasses being forcibly ejected toward the utility serviceperson.

What is claimed is:

1. An electrical service apparatus mountable in an electrical socket having jaw contacts connected to electrical power conductors, the apparatus comprising:
   a housing including a base and a sidewall extending from the base and terminating in an outer end;
   a plurality of rigid connectors mounted through the base and having a first end extending outward from the base adapted for connection to the socket jaw contacts and an opposed second end connectable to an electrical disconnect switch;
   an electrical disconnect switch mounted in the housing, the electrical disconnect switch having switchable contacts connected to the second ends of the connectors to selectively connect and disconnect the connectors;
   a cover mounted over Me the outer end of the side wall of the housing; and
   an opening formed in the cover to open access to the electrical disconnect switch.

2. The apparatus of claim 1 further comprising:
   at least one aperture formed between the cover and the sidewall of the housing permitting gas flow from an interior of the housing externally of the cover.

3. The apparatus of claim 1 wherein the cover further comprises:
   indicia carried on the cover providing watthour meter disconnect and watthour meter reconnect procedures.

4. The apparatus of claim 1 wherein:
   the base and the sidewall are a unitary one piece member.

5. The apparatus of claim 1 wherein:
   the base and the sidewall are annular.

6. The apparatus of claim 1 further comprising:
   a primary handle fixedly extending from the cover.

7. The apparatus of claim 6 wherein:
   the primary handle is mounted on a central lateral axis of the cover.

8. The apparatus of claim 6 wherein:
   the handle includes two spaced side legs fixedly engaged at one end to the cover; and
   a central leg extending between another end of the side legs and spaced from the cover.

9. The apparatus of claim 8 further comprising:
   fasteners extending through at least the cover to fixedly mount the primary handle to the cover.

10. An electrical service apparatus mountable in an electrical socket having jaw contacts connected to electrical power conductors, the apparatus comprising:
    a housing including a base and a sidewall extending from the base;
    a plurality of rigid connectors mounted through the base and having a first end extending outward from the base adapted for connection to the socket jaw contacts and an opposed second end connectable to an electrical disconnect switch;
    an electrical disconnect switch mounted in the housing the electrical disconnect switch having switchable contacts connected to the second ends of the connectors to selectively connect and disconnect the connectors;
    a cover mounted over one end of the side wall of the housing
    an opening formed in the cover to open access to the electrical disconnect switch;
    at least one aperture formed between the cover and the sidewall of the housing permitting gas flow from an interior of the housing externally of the cover; and
    a plurality of radially extending, circumferentially spaced ribs carried on the cover and engagable with one end of the sidewall of the housing to form a plurality of apertures between the cover and the housing.

11. An electrical service apparatus mountable in an electrical socket having jaw contacts connected to electrical power conductors, the apparatus comprising:

a housing including a base and a sidewall extending from the base;

a plurality of rigid connectors mounted through the base and having a first end extending outward from the base adapted for connection to the socket jaw contacts and an opposed second end connectable to an electrical disconnect switch;

an electrical disconnect switch mounted in the housing the electrical disconnect switch having switchable contacts connected to the second ends of the connectors to selectively connect and disconnect the connectors;

a cover mounted over one end of the side wall of the housing;

an opening formed in the cover to open access to the electrical disconnect switch; and a peripheral lip extending from the cover toward the base of the housing, the peripheral lip directing gas flow from the interior of the housing away from the cover and toward the base of the housing.

12. An electrical service apparatus mountable in an electrical socket having jaw contacts connected to electrical power conductors, the apparatus comprising:

a housing including a base and a sidewall extending from the base;

a plurality of rigid connectors mounted through the base and having a first end extending outward from the base adapted for connection to the socket jaw contacts and an opposed second end connectable to an electrical disconnect switch;

an electrical disconnect switch mounted in the housing, the electrical disconnect switch having switchable contacts connected to the second ends of the connectors to selectively connect and disconnect the connectors;

a cover mounted over one end of the side wall of the housing;

an opening formed in the cover to open access to the electrical disconnect switch;

a primary handle fixedly extending from the cover;

an ejector handle mounted with respect to the cover for movement between first and second positions; and at least one ejector arm connected to the ejector handle and extending through the cover and the housing to a distal end disposed exteriorly of the base of the housing, the distal end of the ejector arm movable with respect to the base of the housing upon movement of the ejector handle from the first position to the second position to separate the base of the housing from an attached electrical component.

13. The apparatus of claim 12 further comprising:

a biasing member disposed between the cover and a portion of the ejector handle to bias the ejector handle to the first position.

14. The apparatus of claim 12 further comprising:

the ejector handle having a pair of spaced side legs extending from the cover and a central leg interconnecting opposite ends of the side legs; and a biasing member disposed between the cover and an inner portion of each of the side legs.

15. The apparatus of claim 14 wherein:

the central leg of the ejector handle is spaced from a central leg in the primary handle when the ejector handle is in the first position; and wherein the central leg of the ejector handle is moved toward the central leg of the primary handle when the ejector handle is moved toward the second position.

16. An electrical service apparatus mountable in an electrical socket having jaw contacts connected to electrical line and load power conductors and a bypass lever for selectively connecting the line conductors to the load conductors, the apparatus comprising:

a housing including a base and a sidewall extending from the base;

a plurality of rigid, bus bar connectors mounted through the base, each having a first blade terminal end extending outward from the base adapted for plugging into socket jaw contacts, and an opposed second end; and an electrical disconnect switch mounted in the housing, the electrical disconnect switch having switchable contacts connected to the second ends of the connectors to selectively connect and disconnect the connectors.

17. The apparatus of claim 16 wherein:

the base and the sidewall are a unitary one piece member.

18. The apparatus of claim 16 wherein:

the base and the sidewall are annular.

19. The apparatus of claim 16 wherein:

the connectors fixedly mounting the electrical disconnect switch in the housing.

20. The apparatus of claim 19 further comprising:

a fastener cooperating with the shape of the connectors for fixedly mounting the connectors to the housing.

21. A method for removing and remounting an electrical watthour meter in a meter socket having jaw contacts connected to electrical power comprising the sequential steps of:

removing a socket cover from a socket housing;

moving a socket contact bypass lever to a position connecting bypass contacts between socket line and load jaw contacts;

removing the watthour meter from the socket;

providing a disconnect housing having an electrical disconnect switch carrying switchable contacts connected to a plurality of connectors extending externally of the housing for connection to the socket jaw contacts;

moving an electrical disconnect switch control lever to a position placing the disconnect switch contacts in a closed position;

installing the disconnect housing in a base having jaw contacts receiving the external ends of the connectors on the disconnect housing and external terminals adapted to be engaged with the socket jaw contacts;

installing the disconnect housing and the base into the socket;

moving the socket contact bypass lever to a position moving the bypass contacts to an open position from the socket jaw contacts;

switching the electrical disconnect switch control lever to an off position opening the switchable contacts;

verifying that potential lights carried on the housing are all off; and removing the housing from the base.

22. The method of claim 21 further comprising:

providing an ejector handle on the housing, the ejector handle moving at least one ejector arm extending through the housing to a position when the ejector handle is moved from a normal position to a spaced position to eject the housing from the socket adapter base.

23. The method of claim 21 further comprising the steps to reconnect a watthour meter in a meter socket comprising:

verifying that a main disconnect in the load distribution network is in an off position;

removing the meter opening cover and the socket cover from the socket housing;

with the disconnect switch control lever in the off position, mounting the housing in the base in the socket;

verifying that the load side potential lights are off;

switching the disconnect switch control lever to the on position;

moving the socket contact bypass lever to a position closing socket bypass contacts to connect the socket line contacts to the socket load contacts;

removing the housing and the base from the socket;

installing a watthour meter in the socket jaw contacts;

moving the socket contact bypass lever to a position disconnecting the socket bypass contacts from the socket jaw contacts; and replacing the socket cover.

24. The method of claim 21 further comprising the steps of:

replacing the socket cover on the socket housing; and installing a meter opening cover on the base.

25. The method of claim 24 further comprising the step of:

after the meter opening cover is installed, mounting a seal ring about the meter opening cover and the base to secure the meter opening cover to the base.

* * * * *

UNITED STATES PATENT AND TRADEMARK OFFICE
CERTIFICATE OF CORRECTION

PATENT NO.    : 6,663,405 B1
DATED         : December 16, 2003
INVENTOR(S)   : Darrell Robinson et al.

Page 1 of 1

It is certified that error appears in the above-identified patent and that said Letters Patent is hereby corrected as shown below:

<u>Column 14,</u>
Line 10, delete "Me".

Signed and Sealed this

Twenty-seventh Day of April, 2004

JON W. DUDAS
*Acting Director of the United States Patent and Trademark Office*